United States Patent
Takaki et al.

(10) Patent No.: US 11,295,954 B2
(45) Date of Patent: Apr. 5, 2022

(54) MANUFACTURING METHOD FOR A SEMICONDUCTOR DEVICE INCLUDING A POLYSILICON RESISTOR

(71) Applicant: Mitsubishi Electric Corporation, Tokyo (JP)

(72) Inventors: Yasushi Takaki, Tokyo (JP); Eisuke Suekawa, Tokyo (JP); Chihiro Tadokoro, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 130 days.

(21) Appl. No.: 16/075,158

(22) PCT Filed: Jul. 4, 2016

(86) PCT No.: PCT/JP2016/069810
§ 371 (c)(1),
(2) Date: Aug. 3, 2018

(87) PCT Pub. No.: WO2018/008068
PCT Pub. Date: Jan. 11, 2018

(65) Prior Publication Data
US 2019/0115217 A1 Apr. 18, 2019

(51) Int. Cl.
*H01L 21/66* (2006.01)
*H01L 21/205* (2006.01)
(Continued)

(52) U.S. Cl.
CPC .......... *H01L 21/28035* (2013.01); *G03F 7/20* (2013.01); *H01L 21/02* (2013.01);
(Continued)

(58) Field of Classification Search
CPC ......... H01L 22/10; H01L 22/12; H01L 22/14; H01L 22/30; H01L 22/34;
(Continued)

(56) References Cited

U.S. PATENT DOCUMENTS 4,717,446 A * 1/1988 Nagy .................... B24B 37/013
257/E21.528
4,957,777 A * 9/1990 Ilderem .................. C23C 16/04
257/E21.586

(Continued)

FOREIGN PATENT DOCUMENTS

JP 2005-072476 A 3/2005
JP 2016-508284 A 3/2016

OTHER PUBLICATIONS

International Search Report issued in PCT/JP2016/069810; dated Sep. 20, 2016.
(Continued)

*Primary Examiner* — Maliheh Malek
(74) *Attorney, Agent, or Firm* — Studebaker & Brackett PC

(57) ABSTRACT

Polysilicon films (P1,P2) are simultaneously formed on a wafer (W1) and a monitor wafer (W2) under the same growth condition in a wafer process. At least one of a film thickness and phosphorus concentration of the polysilicon film (P2) formed on the monitor wafer (W2) is measured to obtain a measured value. One of a plurality of mask patterns (A,B,C) is selected based on the measured value. The polysilicon film (P1) formed on the wafer (W1) is etched using the selected mask pattern to form the polysilicon resistor (5).

15 Claims, 9 Drawing Sheets

(51) Int. Cl.
  *H01L 21/225* (2006.01)
  *G03F 7/20* (2006.01)
  *H01L 21/28* (2006.01)
  *H01L 21/02* (2006.01)
  *H01L 49/02* (2006.01)

(52) U.S. Cl.
  CPC .... *H01L 21/02104* (2013.01); *H01L 21/2053* (2013.01); *H01L 21/2257* (2013.01); *H01L 22/10* (2013.01); *H01L 22/12* (2013.01); *H01L 22/14* (2013.01); *H01L 22/34* (2013.01); *H01L 28/20* (2013.01)

(58) Field of Classification Search
  CPC ......... H01L 21/02002; H01L 21/02068; H01L 21/0425; H01L 21/2257; H01L 21/28035; H01L 21/44; H01L 29/40–401; H01L 29/4983; H01L 29/6675; G03F 1/36; G03F 1/38; G03F 1/44; G03F 7/70483–70516; G03F 7/70608
  See application file for complete search history.

(56) References Cited

U.S. PATENT DOCUMENTS

| | | | | |
|---|---|---|---|---|
| 5,393,624 A * | 2/1995 | Ushijima | ........... | G01B 11/0683 118/52 |
| 5,596,207 A * | 1/1997 | Krishnan | ................ | H01L 22/12 257/313 |
| 5,637,153 A * | 6/1997 | Niino | ................ | C23C 16/24 134/2 |
| 6,297,089 B1 * | 10/2001 | Coronel | ........... | H01L 27/10867 257/E21.653 |
| 6,297,877 B1 * | 10/2001 | Hickman | ........... | G03F 7/70891 355/53 |
| 6,391,501 B1 * | 5/2002 | Ohnuma | ................ | G03C 1/005 430/22 |
| 6,569,695 B1 * | 5/2003 | Chen | ................ | G01N 21/9501 257/E21.527 |
| 6,665,858 B2 * | 12/2003 | Miyazaki | ................ | G03F 1/36 430/319 |
| 6,734,458 B2 * | 5/2004 | Kim | ...................... | H01L 23/544 257/48 |
| 7,026,173 B2 * | 4/2006 | Yamashita | .......... | G03F 7/70608 438/692 |
| 7,129,099 B2 * | 10/2006 | Ishii | ....................... | H01L 22/14 438/14 |
| 7,692,275 B2 * | 4/2010 | Anderson | ........... | H01L 27/0207 257/629 |
| 8,062,810 B2 * | 11/2011 | Masanori | ................ | G03F 1/36 430/311 |
| 8,132,130 B2 * | 3/2012 | Chen | ......................... | G03F 1/70 430/333 |
| 2002/0078430 A1 * | 6/2002 | Miyazaki | .................. | G03F 1/36 716/52 |
| 2002/0115228 A1 * | 8/2002 | Kiyota | ................ | G01N 21/956 438/7 |
| 2004/0058459 A1 * | 3/2004 | Cho | .................. | H01L 21/67253 438/2 |
| 2004/0067370 A1 * | 4/2004 | Ebata | ....................... | H01L 22/34 428/446 |
| 2005/0124082 A1 * | 6/2005 | Ishii | ........................ | H01L 22/20 438/14 |
| 2005/0130332 A1 * | 6/2005 | Ishii | ........................ | H01L 22/20 438/14 |
| 2005/0248397 A1 * | 11/2005 | Aota | ..................... | H01L 27/016 327/567 |
| 2006/0019415 A1 * | 1/2006 | Jaiswal | .................... | G01K 7/16 438/14 |
| 2006/0216953 A1 * | 9/2006 | Nakajima | ......... | H01L 21/02148 438/785 |
| 2006/0290343 A1 * | 12/2006 | Crafts | ................ | G01R 1/07357 324/754.18 |
| 2007/0051470 A1 * | 3/2007 | Iwakoshi | .............. | B08B 7/0035 156/345.28 |
| 2008/0010628 A1 * | 1/2008 | Jung | ......................... | G03F 1/36 716/52 |
| 2008/0023699 A1 * | 1/2008 | Lee | ........................ | H01L 22/34 257/48 |
| 2008/0032511 A1 * | 2/2008 | Kabe | ................ | H01L 21/28247 438/771 |
| 2008/0194092 A1 * | 8/2008 | Kaushik | ........... | H01L 21/28176 438/591 |
| 2008/0272371 A1 * | 11/2008 | Li | .......................... | H01L 22/34 257/48 |
| 2011/0193100 A1 * | 8/2011 | Tsuchiya | ............... | H01L 23/544 257/77 |
| 2014/0145240 A1 * | 5/2014 | Harrington, III | ....... | H01L 22/20 257/139 |
| 2015/0008450 A1 * | 1/2015 | Suekawa | ............. | H01L 21/8213 257/77 |
| 2015/0115410 A1 * | 4/2015 | Tokumitsu | .......... | H01L 27/0802 257/536 |
| 2016/0124039 A1 * | 5/2016 | Graetz | ............... | G01R 31/2607 257/48 |
| 2016/0163703 A1 * | 6/2016 | Kaguchi | ............. | H01L 29/78 257/77 |
| 2016/0284610 A1 * | 9/2016 | Usui | ...................... | H01L 22/20 |
| 2021/0167005 A1 * | 6/2021 | Nakata | .................... | H01L 24/48 |

OTHER PUBLICATIONS

Written Opinion issued in PCT/JP2016/069810; dated Sep. 20, 2016.
Notification of Transmittal of the International Search Report and the Written Opinion of the International Searching Authority, or the Declaration issued in PCT/JP2016/069810; dated Sep. 20, 2016.

\* cited by examiner

MANUFACTURING METHOD FOR A SEMICONDUCTOR DEVICE INCLUDING A POLYSILICON RESISTOR

FIELD

The present invention relates to a manufacturing method for a semiconductor device including a polysilicon resistor.

BACKGROUND

Power modules are equipped with a plurality of IGBT chips or MOSFET chips that form an inverter device or the like. In such power modules, a gate resistor is added to a gate terminal of each IGBT chip or each MOSFET chip to suppress inter-chip current unbalances in the modules during switching.

Power modules equipped with an IGBT chip or a MOSFET chip using a Si wafer are generally used by mounting a MELF-type resistor which is an electronic part in a package using solder.

On the other hand, power modules equipped with a MOSFET chip or the like using a SiC wafer are used under high-temperature conditions peculiar to the SiC wafer. Operation under such high-temperature conditions causes thermal fatigue in a solder joint of the MELF-type resistor and causes the resistance value to increase over time, preventing desired operation from being achieved during switching operation. Therefore, it is often the case that a built-in gate resistor formed of polysilicon is used on the MOSFET chip. In this case, in order to suppress inter-chip current unbalances in the module, it is still necessary to measure built-in gate resistance for each chip in a testing step and implement SiC-MOSFET chips with uniform built-in gate resistance.

CITATION LIST

Patent Literature

PTL 1: JP 2016-508284 A

SUMMARY

Technical Problem

According to conventional manufacturing methods, only one type of mask pattern is used to pattern a polysilicon film and form a built-in gate resistor. Therefore, the resistance value of the built-in gate resistor varies depending on a film thickness and phosphorus concentration of the polysilicon film.

Furthermore, a method of causing a plurality of parallel gate resistors to approximate to a specific gate resistor through laser trimming is also being proposed (e.g., see PTL 1). However, the method may cause concentration of current on the remaining part of a laser trimming groove and a resulting temperature rise may cause degradation of reliability.

The present invention has been implemented to solve the above-described problems, and it is an object of the present invention to provide a manufacturing method for a semiconductor device capable of suppressing a variation in resistance value of a polysilicon resistor.

Solution to Problem

A manufacturing method for a semiconductor device according to the present invention includes: simultaneously forming polysilicon films on a wafer and a monitor wafer under the same growth condition in a wafer process; measuring at least one of a film thickness and phosphorus concentration of the polysilicon film formed on the monitor wafer to obtain a measured value; selecting one of a plurality of mask patterns based on the measured value; and etching the polysilicon film formed on the wafer using the selected mask pattern to form the polysilicon resistor.

Advantageous Effects of Invention

The present invention measures at least one of the film thickness and the phosphorus concentration of the polysilicon film formed on the monitor wafer, etches the polysilicon film formed on the wafer using a mask pattern selected based on the measured value to form the polysilicon resistor. Thus, even when there is a variation in the film thickness or the phosphorus concentration of the polysilicon film, it is possible to suppress the variation in the resistance value of the polysilicon film.

DESCRIPTION OF EMBODIMENTS

A manufacturing method for a semiconductor device according to the embodiments of the present invention will be described with reference to the drawings. The same components will be denoted by the same symbols, and the repeated description thereof may be omitted.

First Embodiment

Figure 1:
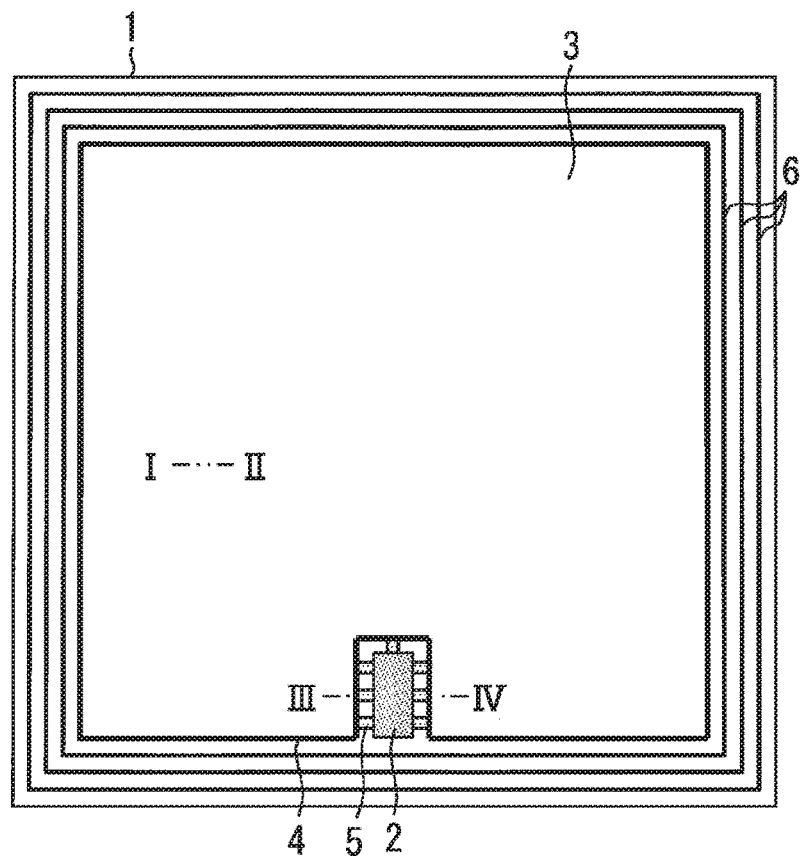
FIG. 1 is a plan view illustrating a semiconductor device according to a first embodiment of the present invention.

FIG. 1 is a plan view illustrating a semiconductor device according to a first embodiment of the present invention. This semiconductor device is a SiC-MOSFET chip. A gate pad 2 and a source pad 3 are formed in a central part of an N$^+$-type SiC substrate 1. The gate pad 2 is connected to a gate wiring 4 surrounding the source pad 3 via a built-in gate resistor 5. The built-in gate resistor 5 includes a plurality of resistors connected in parallel to each other. The gate pad 2, the source pad 3 and the gate wiring 4 are made of Al and the built-in gate resistor 5 is made of polysilicon doped with phosphorus. Field limiting rings 6 are formed on peripheral portions of the N$^+$-type SiC substrate 1 so as to surround these parts.

Figure 2:
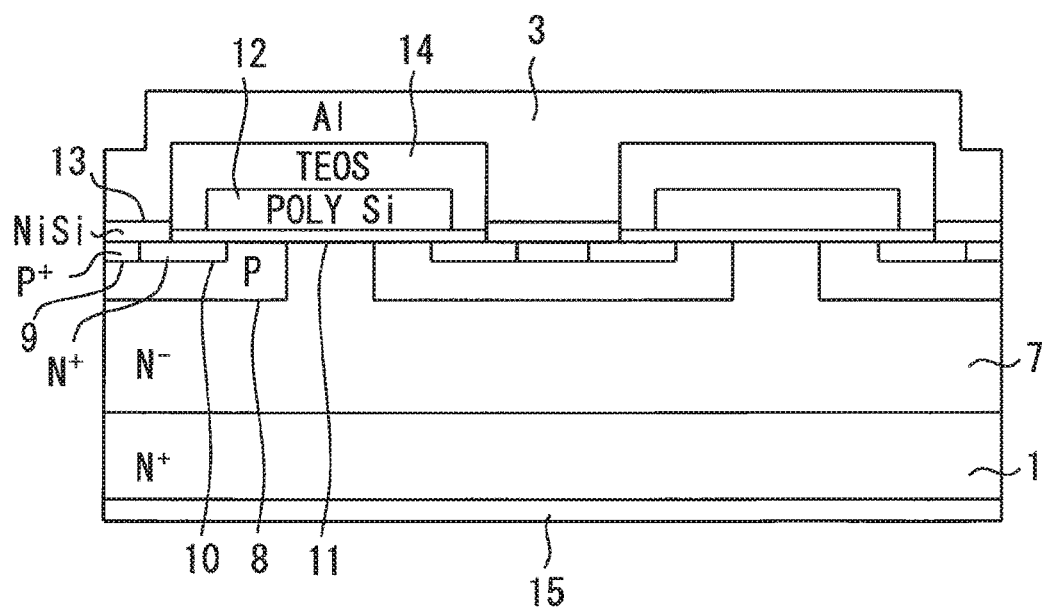
FIG. 2 is a cross-sectional view along I-II in FIG. 1.

FIG. 2 is a cross-sectional view along I-II in FIG. 1. An N$^-$-type SiC epitaxial layer 7 is formed on the N$^+$-type SiC substrate 1. A P-type well layer 8 is formed on part of the N$^-$-type SiC epitaxial layer 7. A P$^+$-type contact layer 9 and an N$^+$-type source layer 10 are formed on the P-type well layer 8. A polysilicon gate electrode 12 is formed on the N$^-$-type SiC epitaxial layer 7, the P-type well layer 8 and the N$^+$-type source layer 10 via an SiO$_2$ gate oxide film 11. A source pad 3 is connected to the P$^+$-type contact layer 9 and the N$^+$-type source layer 10 via an NiSi film 13. The gate electrode 12 is insulated from the source pad 3 by a TEOS 14. A drain electrode 15 is formed on an undersurface of the N$^+$-type SiC substrate 1.

Figure 3:
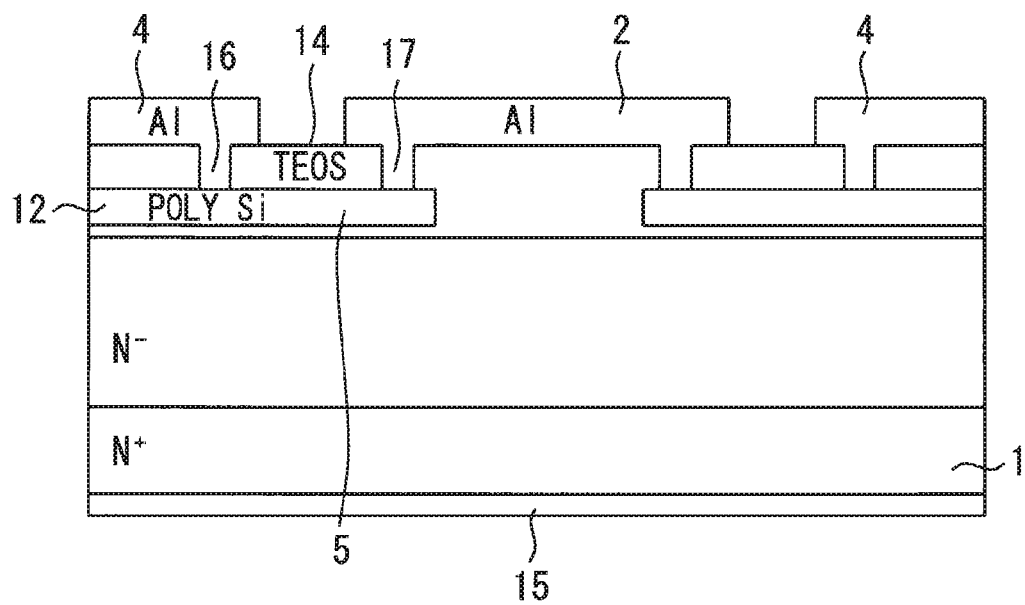
FIG. 3 is a cross-sectional view along III-IV in FIG. 1.

FIG. 3 is a cross-sectional view along III-IV in FIG. 1. The gate electrode 12 is connected to the gate wiring 4 via a polysilicon contact 16. The gate wiring 4 and the gate pad 2 are connected together via the built-in gate resistor 5. The gate pad 2 is connected to the built-in gate resistor 5 via a polysilicon contact 17.

Figure 4:
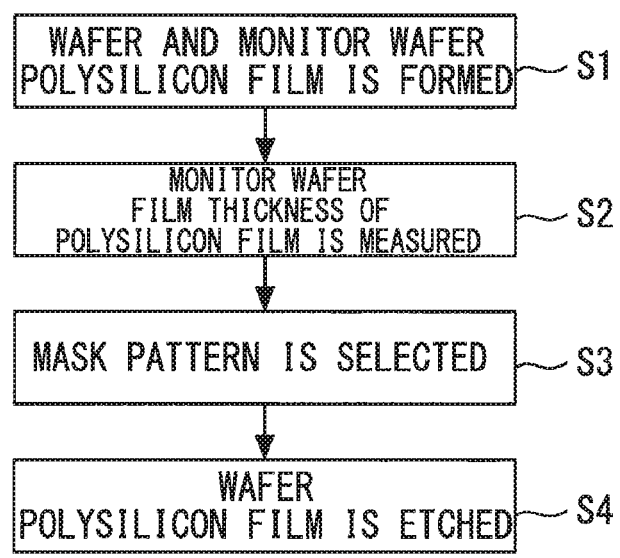
FIG. 4 is a flowchart of the manufacturing method for a semiconductor device according to the first embodiment of the present invention.
Figure 5:
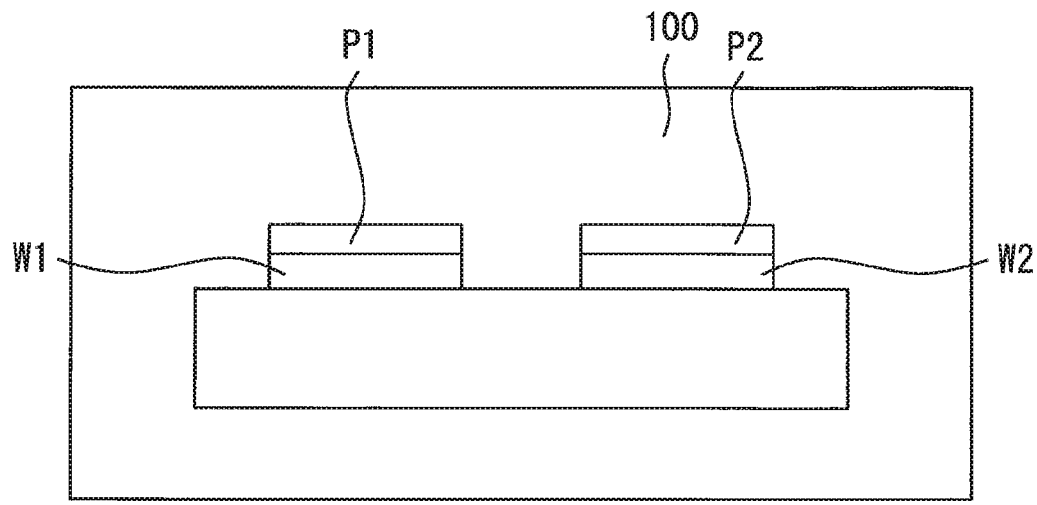
FIG. 5 is a cross-sectional view for describing a manufacturing method for a built-in gate resistor according to the first embodiment of the present invention.

Next, a manufacturing method for a semiconductor device according to the present embodiment will be described. FIG. 4 is a flowchart of the manufacturing method for a semiconductor device according to the first embodiment of the present invention. FIG. 5 is a cross-sectional view for describing a manufacturing method for a built-in gate resistor according to the first embodiment of the present invention. First, in a wafer process, polysilicon films P1 and P2 are simultaneously formed on a wafer W1 and a monitor wafer W2 respectively in the same deposition apparatus 100 under the same growth condition (step S1). The polysilicon films P1 and P2 on both wafers have the same film thickness and the same phosphorus concentration or the like. Here, the wafer W1 corresponds to the N$^+$-type SiC substrate 1 in FIGS. 1 to 3. Although the wafer W1 and the monitor wafer W2 have the same material and size or the like, they are different wafers.

Next, using a film thickness measuring instrument such as an ellipsometer, a film thickness of the polysilicon film P2 formed on the monitor wafer W2 is measured to obtain a measured value (step S2). Next, based on the measured value, one of a plurality of mask patterns is selected (step S3). Next, using the selected mask pattern, a resist is patterned by photolithography. Using the patterned resist as a mask, the polysilicon film P1 formed on the wafer W1 is etched by a RIE dry etching method to form the built-in gate resistor 5 and the gate electrode 12 (step S4).

Figure 6:
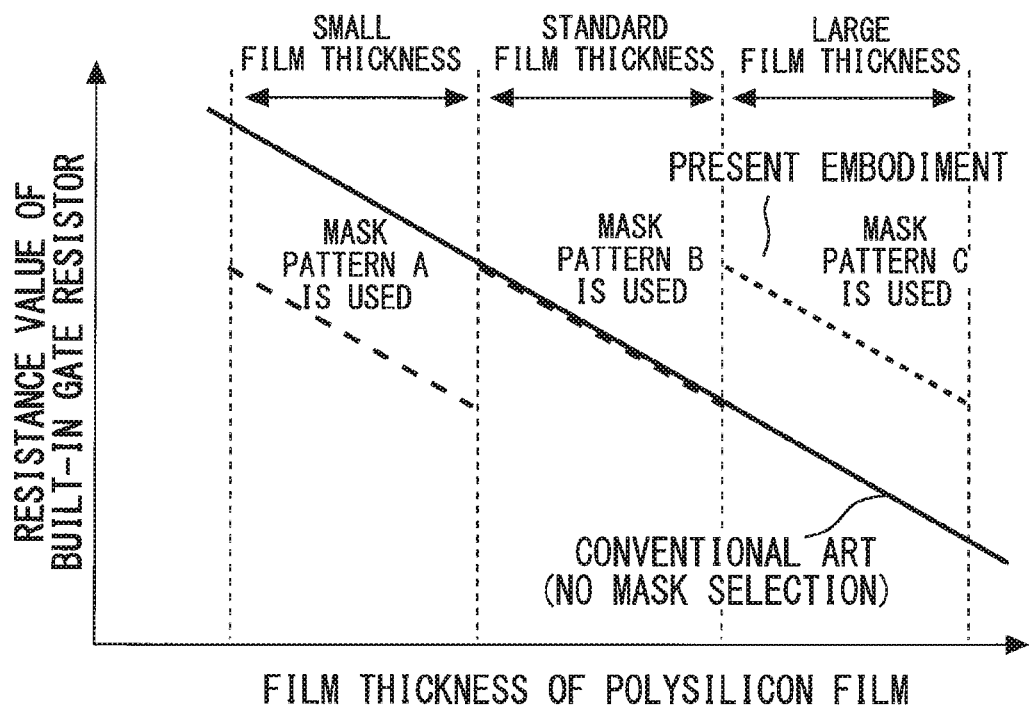
FIG. 6 is a diagram illustrating a relationship between a film thickness of the polysilicon film and a resistance value of the built-in gate resistor.

FIG. 6 is a diagram illustrating a relationship between a film thickness of the polysilicon film and a resistance value of the built-in gate resistor. The smaller the film thickness of the polysilicon film, the greater the resistance value of the polysilicon film becomes. Therefore, a mask pattern is selected so that the resistance value of the built-in gate resistor 5 decreases as the film thickness of the polysilicon film P2 formed on the monitor wafer W2 decreases. Thus, even when the film thicknesses of the polysilicon films P1 and P2 vary, it is possible to suppress the variation in the resistance value of the built-in gate resistor 5.

Figure 7:
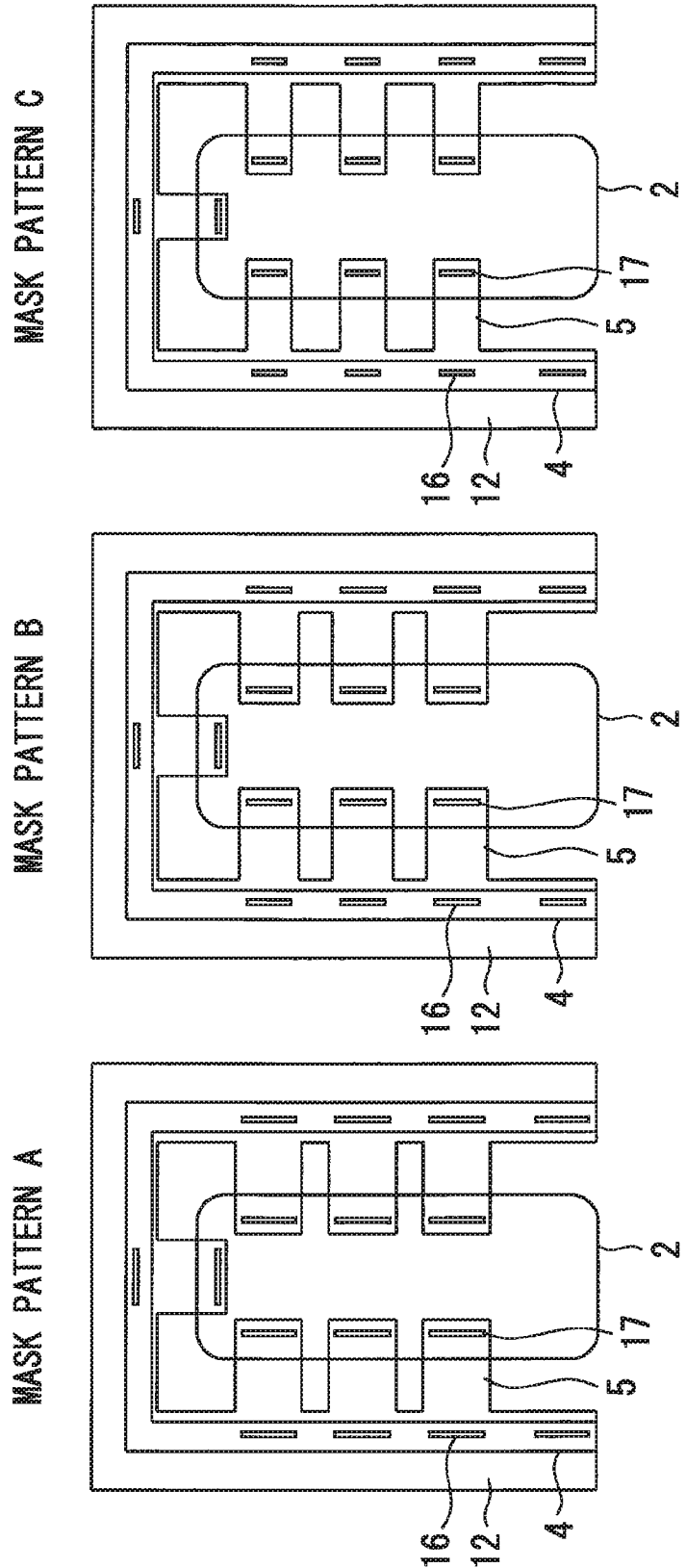
FIG. 7 is a plan view illustrating the built-in gate resistor formed using three types of mask patterns according to the first embodiment of the present invention.

In the present embodiment, the resistance value of the built-in gate resistor 5 is adjusted by changing the width of the built-in gate resistor 5 based on the measured value. FIG. 7 is a plan view illustrating the built-in gate resistor formed using three types of mask patterns according to the first embodiment of the present invention. When the film thickness of the polysilicon film P2 formed on the monitor wafer W2 is small, the polysilicon films P1 and P2 have large resistance values, and therefore a mask pattern A, the built-in gate resistor 5 of which has a larger width than that of a standard mask pattern B is used. Conversely, when the film thickness is large, a mask pattern C, the built-in gate resistor 5 of which has a smaller width than that of the standard mask pattern B is used. That is, a mask pattern is selected so that the width of the built-in gate resistor 5 increases as the film thickness of the polysilicon film P2 formed on the monitor wafer W2 decreases. It is thereby possible to set the resistance value of the built-in gate resistor 5 to a desired value. Note that mask patterns are not limited to three types but four or more types of mask patterns may be used.

Figure 8:
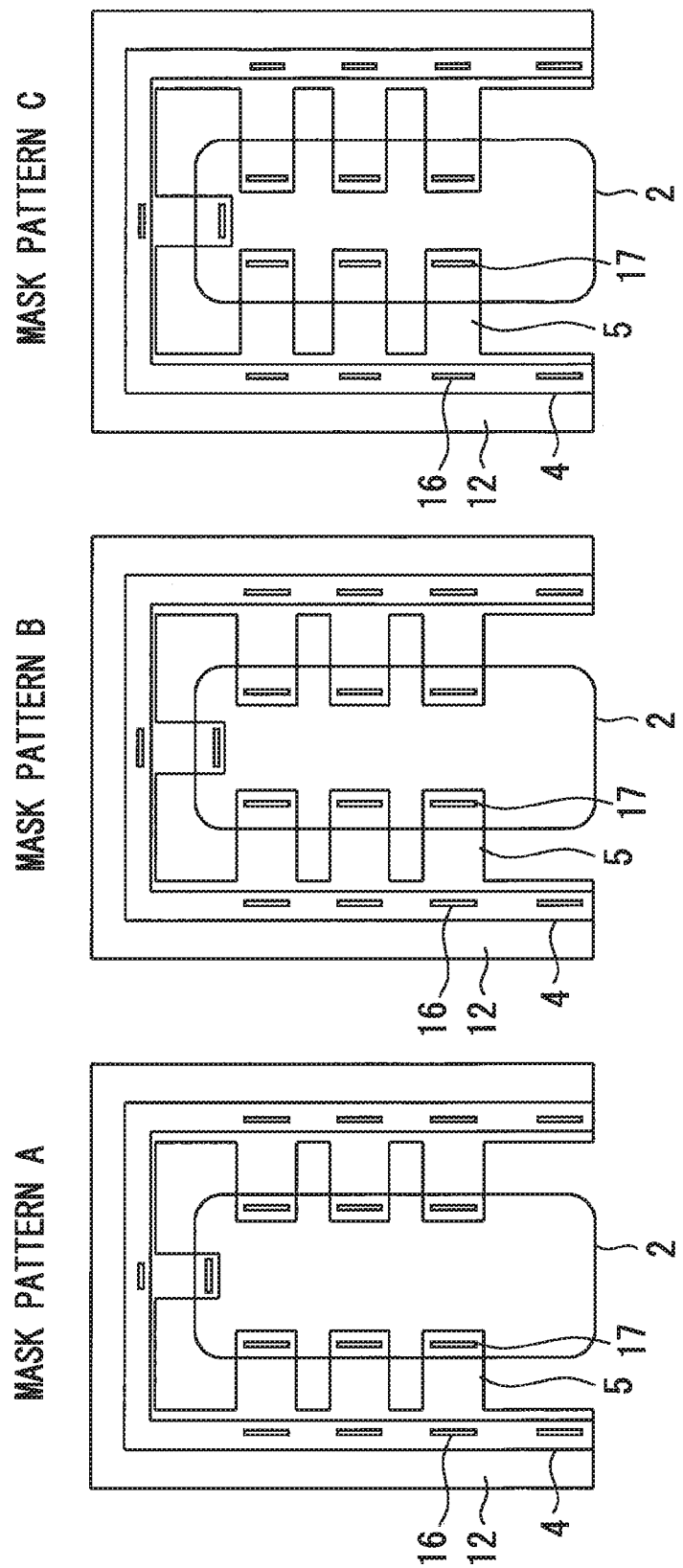
FIG. 8 is a plan view illustrating built-in gate resistors formed using three types of mask patterns according to modification 1 of the first embodiment of the present invention.

The resistance value of the built-in gate resistor 5 may be adjusted by changing the length of the built-in gate resistor 5 based on the measured value. FIG. 8 is a plan view illustrating built-in gate resistors formed using three types of mask patterns according to modification 1 of the first embodiment of the present invention. When the film thickness of the polysilicon film P2 formed on the monitor wafer W2 is small, the polysilicon films P1 and P2 have larger resistance values, and so the mask pattern A, the length of the built-in gate resistor 5 of which is smaller than that of the standard mask pattern B is used. Conversely, when the film thickness is large, the mask pattern C, the length of the built-in gate resistor 5 of which is larger than that of the standard mask pattern B is used. That is, a mask pattern is selected so that the length of the built-in gate resistor 5 decreases as the film thickness of the polysilicon film P2 formed on the monitor wafer W2 decreases. It is thereby possible to set the resistance value of the built-in gate resistor 5 to a desired value.

Figure 9:
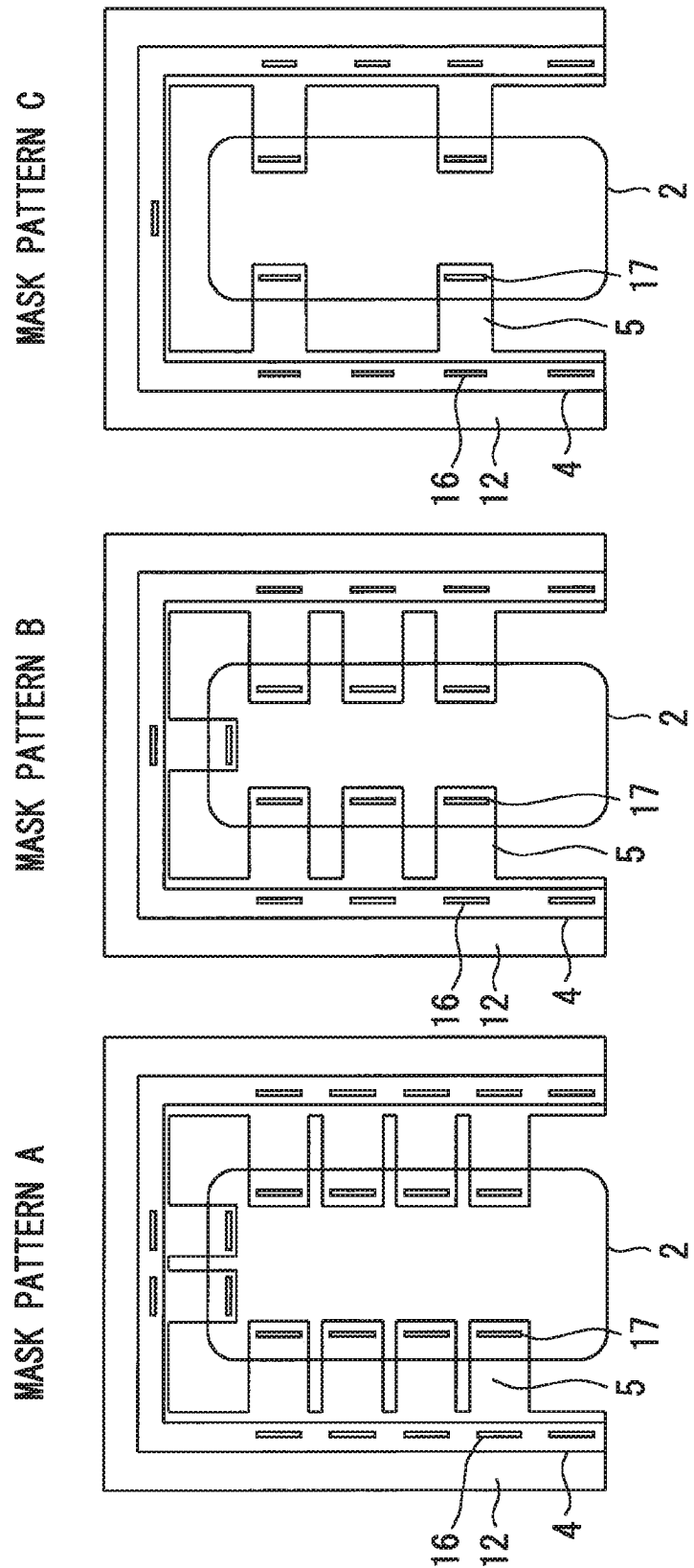
FIG. 9 is a plan view illustrating built-in gate resistors formed using three types of mask patterns according to modification 2 of the first embodiment of the present invention.

Furthermore, the resistance value of the built-in gate resistor 5 may be adjusted by changing the number of the plurality of resistors based on the measured value. FIG. 9 is a plan view illustrating built-in gate resistors formed using three types of mask patterns according to modification 2 of the first embodiment of the present invention. When the film thickness of the polysilicon film P2 formed on the monitor wafer W2 is small, the polysilicon films P1 and P2 have larger resistance values, and so the mask pattern A, the number of the plurality of resistors of which is larger than that of the standard mask pattern B is used. Conversely, when the film thickness is large, the mask pattern C, the number of the plurality of resistors of which is smaller than that of the standard mask pattern B is used. That is, a mask pattern is selected so that the number of the plurality of resistors increases as the film thickness of the polysilicon film P2 formed on the monitor wafer W2 decreases. It is thereby possible to set the resistance value of the built-in gate resistor 5 to a desired value.

As described above, in the present embodiment, the film thickness of the polysilicon film P2 formed on the monitor wafer W2 is measured, the polysilicon film P1 formed on the wafer W2 is etched using a mask pattern selected based on the measured value to form the built-in gate resistor 5. Thus, even when there is a variation in the film thickness of the polysilicon film P1, it is possible to suppress the variation in the resistance value of the built-in gate resistor 5.

Figure 10:
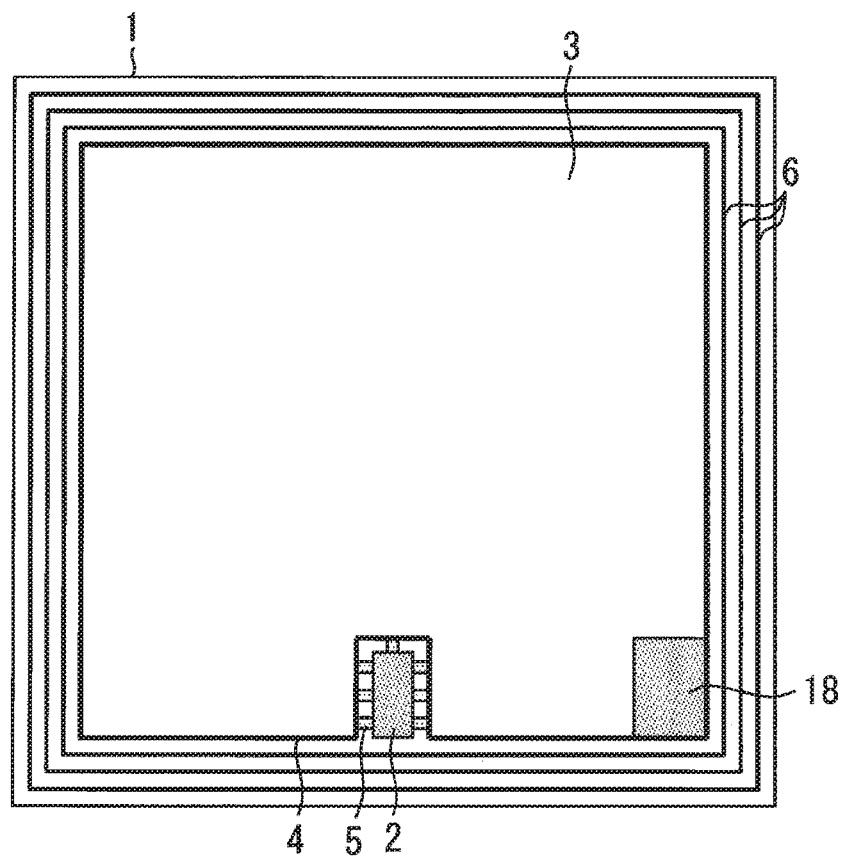
FIG. 10 is a plan view illustrating a semiconductor device according to a comparative example.
Figure 11:
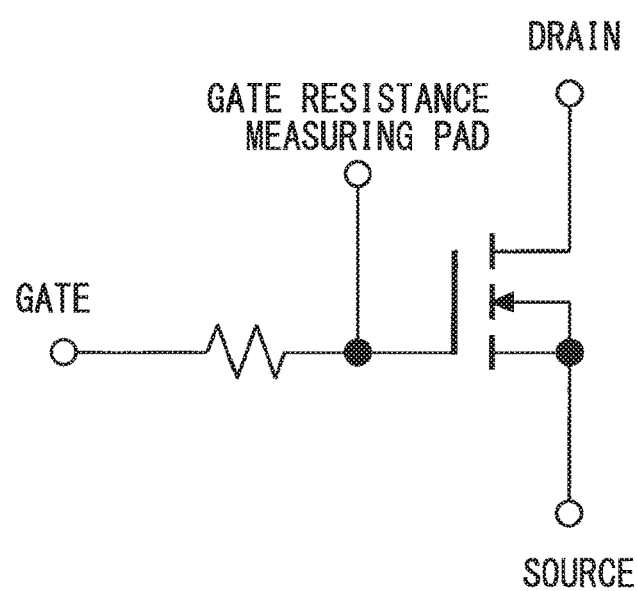
FIG. 11 is an equivalent circuit diagram of the semiconductor device according to the comparative example.

FIG. 10 is a plan view illustrating a semiconductor device according to a comparative example. FIG. 11 is an equivalent circuit diagram of the semiconductor device according to the comparative example. In the comparative example, a gate resistance value between a gate measuring pad 18 and a gate terminal is measured for each chip. Therefore, since the gate measuring pad 18 needs to be provided in the chip, the ineffective region of the chip increases and the chip area expands, resulting in an increase in the chip cost. In contrast, in the present embodiment, since the gate measuring pad 18 is unnecessary, the ineffective area region becomes smaller and the cost can be reduced.

Second Embodiment

Figure 12:
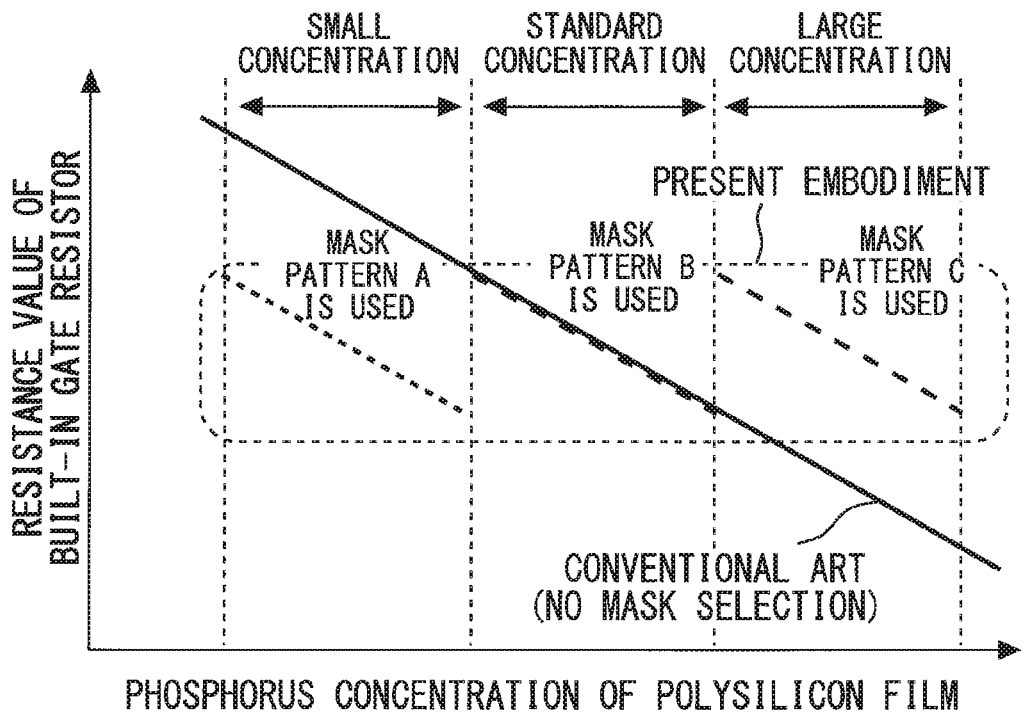
FIG. 12 is a diagram illustrating a relationship between the phosphorus concentration of the polysilicon film and the resistance value of the built-in gate resistor.

Polysilicon which serves as gate wiring for MOSFET or the like is generally doped with phosphorus to adjust the resistance value. The higher the phosphorus concentration, the smaller the resistance value of polysilicon becomes. FIG. 12 is a diagram illustrating a relationship between the phosphorus concentration of the polysilicon film and the resistance value of the built-in gate resistor. Since the higher the phosphorus concentrations of the polysilicon films P1 and P2, the smaller the resistance values of the polysilicon films P1 and P2 become. Thus, if the same pattern is used, the resistance value of the built-in gate resistor 5 becomes smaller.

Figure 13:
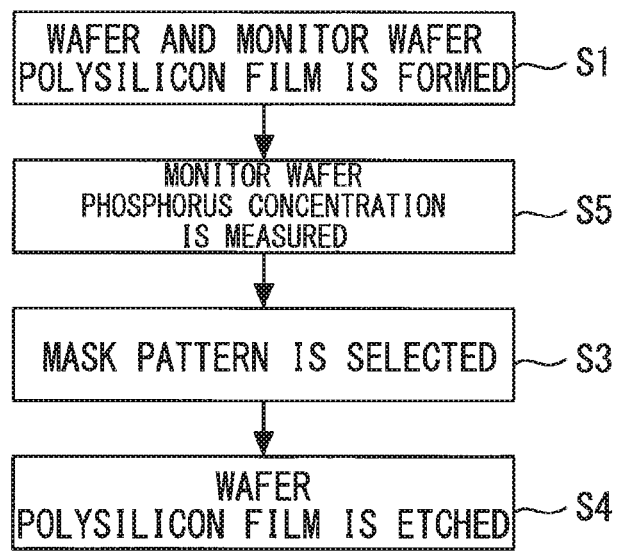
FIG. 13 is a flowchart of a manufacturing method for a semiconductor device according to a second embodiment of the present invention.

FIG. 13 is a flowchart of a manufacturing method for a semiconductor device according to a second embodiment of the present invention. In the present embodiment, a phosphorus concentration of the polysilicon film P2 formed on the monitor wafer W2 is measured using an element analysis apparatus such as a fluorescent X-ray analysis apparatus instead of step S2 in the first embodiment to obtain a measured value (step S5). The built-in gate resistor 5 is formed using a mask pattern selected based on this measured value. More specifically, a mask pattern is selected so that the resistance value of the built-in gate resistor 5 decreases as the phosphorus concentration decreases. Thus, even when there is a variation in the phosphorus concentration of the polysilicon film P1, it is possible to suppress the variation in the resistance value of the built-in gate resistor 5. Furthermore, since the pad for measuring the gate resistance value is unnecessary, the ineffective area region of the chip becomes narrower and it is possible to achieve a cost reduction.

Third Embodiment

Figure 14:
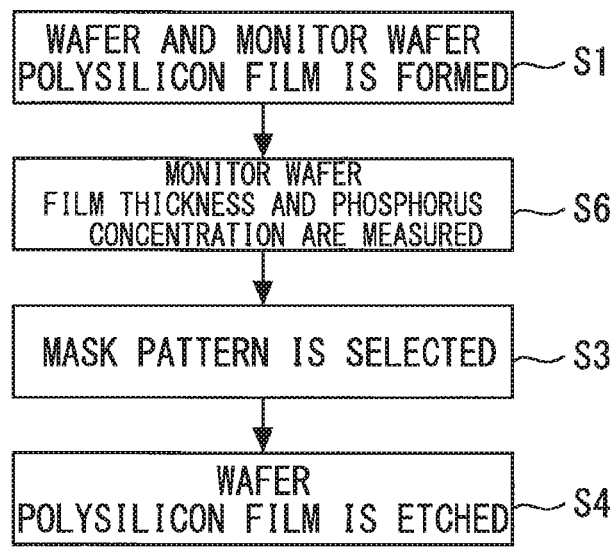
FIG. 14 is a flowchart of a manufacturing method for a semiconductor device according to a third embodiment of the present invention.
Figure 15:
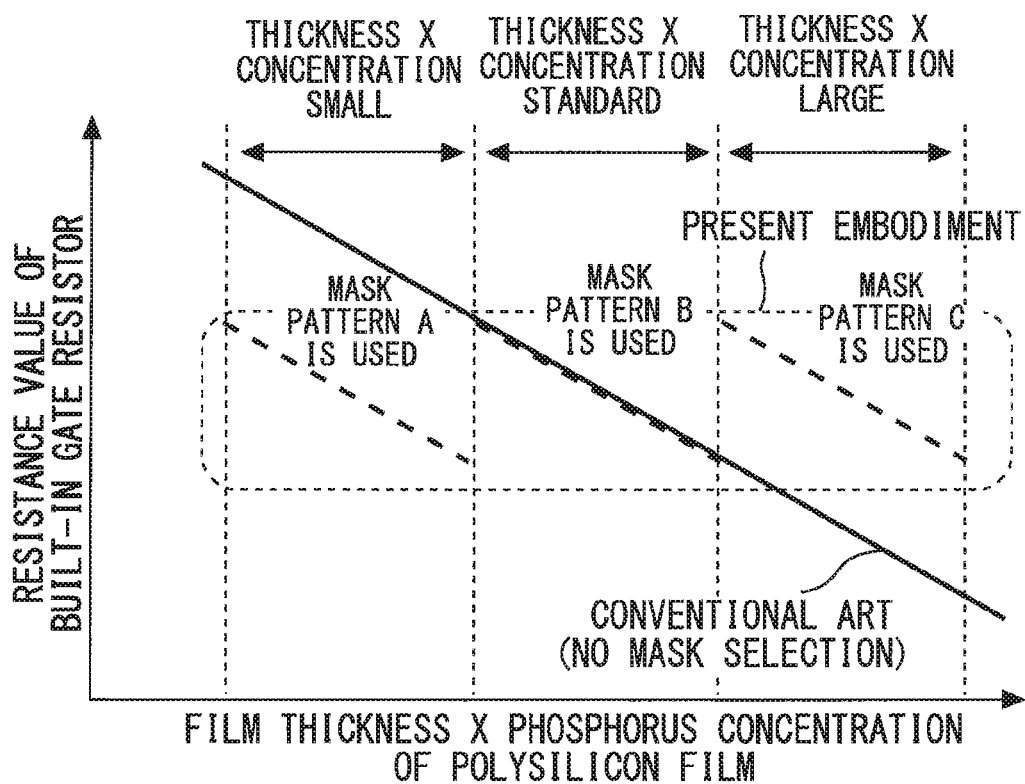
FIG. 15 is a diagram illustrating a relationship between the product of the film thickness and the phosphorus concentration of the polysilicon film, and the resistance value of the built-in gate resistor.

FIG. 14 is a flowchart of a manufacturing method for a semiconductor device according to a third embodiment of the present invention. FIG. 15 is a diagram illustrating a relationship between the product of the film thickness and the phosphorus concentration of the polysilicon film, and the resistance value of the built-in gate resistor. Instead of step S2 of the first embodiment, in the present embodiment, both the film thickness and the phosphorus concentration of the polysilicon film P2 formed on the monitor wafer W2 are measured and these measured values are integrated to obtain a measured value (step S6). A polysilicon resistor is formed using a mask pattern selected based on the measured value. More specifically, a mask pattern is selected so that the resistance value of the built-in gate resistor 5 decreases as the product of the film thickness and the phosphorus concentration decreases. Thus, it is possible to suppress a variation in the resistance value of the built-in gate resistor 5 still more than the first and second embodiments. Moreover, since the pad for measuring the gate resistance value is unnecessary, the ineffective area region of the chip becomes narrower and it is possible to achieve a cost reduction.

In the first to third embodiments, the $N^+$-type SiC substrate 1 etc. are not limited to parts formed of silicon carbide, but instead may be formed of other wide-bandgap semiconductor, for example, a gallium-nitride-based material, or diamond, having a bandgap wider than that of silicon. A power semiconductor device formed of such a wide-bandgap semiconductor has a high voltage resistance and a high allowable current density, and thus can be miniaturized. The use of such a miniaturized semiconductor device enables the miniaturization of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST

1 $N^+$-type SiC substrate (wafer); 5 built-in gate resistor (polysilicon resistor); A,B,C mask pattern

The invention claimed is:
1. A manufacturing method for a semiconductor device comprising:
   simultaneously forming polysilicon films on a wafer and a monitor wafer under the same growth condition in a wafer process;
   measuring at least one of a film thickness and phosphorus concentration of the polysilicon film formed on the monitor wafer to obtain a measured value;
   selecting one of a plurality of mask patterns based on the measured value, each mask pattern of the plurality of mask patterns having a different number of resulting resistors, a different width of resulting resistors, and/or a different length of resulting resistors; and
   etching the polysilicon film formed on the wafer using the selected mask pattern to form the polysilicon resistor.
2. The manufacturing method for a semiconductor device according to claim 1, wherein
   the mask pattern is selected so that a resistance value of the polysilicon resistor decreases as the film thickness of the polysilicon film formed on the monitor wafer decreases.
3. The manufacturing method for a semiconductor device according to claim 1, wherein
   the mask pattern is selected so that a resistance value of the polysilicon resistor decreases as the phosphorus concentration of the polysilicon film formed on the monitor wafer decreases.
4. The manufacturing method for a semiconductor device according to claim 2, wherein the mask pattern is selected so that a width of the polysilicon resistor increases as the film thickness of the polysilicon film formed on the monitor wafer decreases.

5. The manufacturing method for a semiconductor device according to claim 3, wherein
the mask pattern is selected so that a width of the polysilicon resistor increases as the phosphorus concentration of the polysilicon film formed on the monitor wafer decreases.

6. The manufacturing method for a semiconductor device according to claim 2, wherein
the mask pattern is selected so that a length of the polysilicon resistor decreases as the film thickness of the polysilicon film formed on the monitor wafer decreases.

7. The manufacturing method for a semiconductor device according to claim 3, wherein
the mask pattern is selected so that a length of the polysilicon resistor decreases as the phosphorus concentration of the polysilicon film formed on the monitor wafer decreases.

8. The manufacturing method for a semiconductor device according to claim 2, wherein
the polysilicon resistor includes a plurality of resistors connected in parallel to each other, and
the mask pattern is selected so that the number of the plurality of resistors increases as the film thickness of the polysilicon film formed on the monitor wafer decreases.

9. The manufacturing method for a semiconductor device according to claim 3, wherein
the polysilicon resistor includes a plurality of resistors connected in parallel to each other, and
the mask pattern is selected so that the number of the plurality of resistors increases as the phosphorus concentration of the polysilicon film formed on the monitor wafer decreases.

10. The manufacturing method for a semiconductor device according to claim 1, further comprising:
forming a transistor structure having a gate, a gate wiring and a gate pad which are connected to the gate on the wafer, wherein
the polysilicon resistor is a built-in gate resistor connected between the gate wiring and the gate pad.

11. The manufacturing method for a semiconductor device according to claim 2, wherein
the mask pattern is selected so that a resistance value of the polysilicon resistor decreases as the phosphorus concentration of the polysilicon film formed on the monitor wafer decreases.

12. The manufacturing method for a semiconductor device according to claim 11, wherein
the mask pattern is selected so that a width of the polysilicon resistor increases as the phosphorus concentration of the polysilicon film formed on the monitor wafer decreases.

13. The manufacturing method for a semiconductor device according to claim 11, wherein
the mask pattern is selected so that a length of the polysilicon resistor decreases as the phosphorus concentration of the polysilicon film formed on the monitor wafer decreases.

14. The manufacturing method for a semiconductor device according to claim 11, wherein
the polysilicon resistor includes a plurality of resistors connected in parallel to each other, and
the mask pattern is selected so that the number of the plurality of resistors increases as the phosphorus concentration of the polysilicon film formed on the monitor wafer decreases.

15. The manufacturing method for a semiconductor device according to claim 1, wherein
the measuring at least one of a film thickness and phosphorus concentration of the polysilicon film formed on the monitor wafer is conducted via at least one of an ellipsometer and fluorescent X-ray analysis.

* * * * *